United States Patent
Yabara

(10) Patent No.: US 8,223,045 B2
(45) Date of Patent: Jul. 17, 2012

(54) D/A CONVERTER AND ELECTRON BEAM EXPOSURE APPARATUS

(75) Inventor: Hidefumi Yabara, Tokyo (JP)

(73) Assignee: Advantest Corp., Tokyo (JP)

( * ) Notice: Subject to any disclaimer, the term of this patent is extended or adjusted under 35 U.S.C. 154(b) by 139 days.

(21) Appl. No.: 12/800,568

(22) Filed: May 18, 2010

(65) Prior Publication Data
US 2010/0314560 A1    Dec. 16, 2010

Related U.S. Application Data

(63) Continuation of application No. PCT/JP2007/072455, filed on Nov. 20, 2007.

(51) Int. Cl.
    *H03M 1/06*    (2006.01)
(52) U.S. Cl. ........................... 341/118; 341/144
(58) Field of Classification Search .............. 341/144, 341/118, 120, 121, 119, 145, 146
See application file for complete search history.

(56) References Cited

U.S. PATENT DOCUMENTS 7,148,827 B2 * 12/2006 Lee ................................ 341/118

FOREIGN PATENT DOCUMENTS

| JP | 56-122524 | 9/1981 |
| JP | S56-122524 | 9/1981 |
| JP | 59-167112 | 9/1984 |
| JP | S59-167112 | 9/1984 |
| JP | 59-186416 | 10/1984 |
| JP | S59-186416 | 10/1984 |
| JP | 11-329322 | 11/1999 |

OTHER PUBLICATIONS

International Search Report, English translation of the International Search Report.

* cited by examiner

*Primary Examiner* — Joseph Lauture
(74) *Attorney, Agent, or Firm* — Muramatsu & Associates

(57) ABSTRACT

A D/A converter includes a D/A converter base part having a first D/A converter unit performing D/A conversion of high order bits and a second D/A converter unit performing D/A conversion of low order bits and including an auxiliary bit assigned an identical weight to a least significant bit, a correction D/A converter part, an error detection processing section generating a digital code supplied to a correction D/A converter unit in the correction D/A converter part, and a control section. The control section compares one bit current source with another bit current source in a lower order than the one bit current source, and corrects a value of the one bit current source by causing to supply the digital code to the correction D/A converter unit when the value of the one bit current source changes.

16 Claims, 10 Drawing Sheets

D/A CONVERTER AND ELECTRON BEAM EXPOSURE APPARATUS

CROSS-REFERENCE TO RELATED APPLICATIONS

This application is a continuation of prior International Patent Application No. PCT/JP2007/072455, filed Nov. 20, 2007, the entire contents of which are incorporated herein by reference.

BACKGROUND OF THE INVENTION

1. Field of the Invention

The present invention relates to a D/A converter and to an electron beam exposure apparatus. More specifically, the present invention relates to a D/A converter provided with a self-calibrating function and to a multi-column electron beam exposure apparatus equipped with the D/A converter and provided with multiple columns to perform an exposure process in parallel on a single wafer.

2. Description of the Prior Art

In recent years, electron beam exposure apparatuses are coming into use to form fine patterns in lithographic processes for manufacturing semiconductor devices and the like.

An electron beam exposure apparatus provides better resolution than a photolithography apparatus but also has a problem of lower exposure throughput than the photolithography apparatus. To deal with this problem, a multi-column electron beam exposure apparatus has been proposed which has exposure throughput improved by being provided with multiple columns (each called a column cell) to form patterns on a resist by irradiating the resist with electron beams. Though each of the column cells is equivalent to a column in a single-column electron beam exposure apparatus, the multi-column electron beam exposure apparatus can multiply the exposure throughput by the number of the columns by performing the processes in parallel at the same time.

As a related technique, Japanese Patent Application Publication No. Hei 11-329322 discloses a multi-column electron beam exposure apparatus configured to expose identical patterns in parallel at the same time onto a single wafer while correcting pattern data according to displacement of an optical axis in each of the columns.

Meanwhile, in order to improve the exposure throughput, a mask is provided with either a variable rectangular aperture or multiple mask patterns, and a pattern is selected by beam deflection and thus is transferred onto a wafer by exposure. There is disclosed an electron beam exposure apparatus configured to perform character projection by using multiple mask patterns as described above. In the character projection, a pattern is transferred onto a sample surface as described below. Specifically, a certain pattern region selected by beam deflection from multiple patterns arranged on the mask is irradiated with a beam, and a beam cross section is shaped into the pattern shape. Then, the beam passed through the mask is deflected back by a deflector located at a later stage, reduced to a certain reduction ratio determined by an electron optical system, and transferred to a desired position on a sample by a sample surface positioning deflector.

Such an electron beam exposure apparatus deflects the beam based on exposure data provided in advance to select a character projection pattern or to irradiate a predetermined position on the wafer with the beam. The exposure data is digitalized and transmitted to deflection units of the respective columns and converted into analog data through D/A conversion, whereby signals are applied to deflection electrodes.

The multi-column electron beam apparatus requires, for each beam, approximately 40 channels of high-resolution (multi-bit) high-speed D/A converters for the purposes of mask selection and beam positioning on the wafer. Accordingly, an exposure apparatus configured to perform four-beam parallel processing requires approximately 160 channels.

Assuming that minimum drawing position accuracy is 0.5 nm, the electron beam exposure apparatus is required to have resolution of $4 \times 10^5$ or more in order to cover a deflecting region of $200 \times 200$ $\mu m^2$, and accordingly needs a D/A converter having resolution of about 19 bits as well as stability.

In order to achieve a high-speed D/A converter, Japanese Patent Application Publication No. Sho 59-186416 discloses a D/A converter with a segment structure. Also, a current switch D/A converter using a bipolar transistor for higher speed is commercially available. However, these D/A converters cannot be expected to achieve accuracy of 17 bits or more due to base current variation or collector-emitter voltage variation.

Meanwhile, in order to achieve high accuracy, the D/A converter generally adopts a configuration to obtain output bit currents by using a current mirror while making reference to a highly accurate reference current. However, this configuration may only achieve accuracy around 16 bits because variation of around ten and several parts per million is assumed during monolithic manufacturing.

Moreover, trimming using a laser or a fuse is generally performed to assure linearity. However, this trimming is high in cost and low in accuracy. In addition, the linearity cannot be assured over time after the D/A converter is mounted on the apparatus, because the D/A converter varies over time.

SUMMARY OF THE INVENTION

The present invention has been made in view of the foregoing problems of the conventional techniques. An object of the present invention is to provide a D/A converter having high resolution and favorable linearity with respect to digital values and an electron beam exposure apparatus including the D/A converter.

The above problems can be solved by a digital-to-analog converter including: a digital-to-analog converter base part including a first digital-to-analog converter unit configured to perform digital-to-analog conversion of high order bits and a second digital-to-analog converter unit configured to perform digital-to-analog conversion of low order bits, the second digital-to-analog converter unit being provided with an auxiliary bit which is assigned with weight identical to a least significant bit; a correction digital-to-analog converter part configured to adjust a signal outputted from the first digital-to-analog converter unit in the digital-to-analog converter base part; an error detection processing section configured to generate a digital code to be supplied to a correction digital-to-analog converter unit in the correction digital-to-analog converter part; and a control section configured to control the digital-to-analog converter base part, the correction digital-to-analog converter part, and the error detection processing section. In the digital-to-analog converter, the first digital-to-analog converter unit includes first bit current sources whose number is equal to the number of the decoded high order bits, the second digital-to-analog converter unit includes second bit current sources whose number corresponds to a bit number of the low order bits and an auxiliary least significant current source corresponding to the auxiliary bit, and the control section compares one of the plurality of first bit current sources with the second bit current sources in a lower order than the first bit current source, and corrects a value of the first bit current source by causing the error detection processing section to generate the digital code to be supplied to the correction digital-to-analog converter unit when judging that the value of the first bit current source changes.

In the above digital-to-analog converter, the correction digital-to-analog converter part may include a linearity correction digital-to-analog converter unit, and the control section may compare a comparison target signal with a reference signal where the comparison target signal is a current value of one of the first bit current sources and the reference signal is a current value obtained by adding an output current from the auxiliary least significant current source to a total output current from all the lower-ordered second bit current sources in ON state, and sets a digital code to the linearity correction digital-to-analog converter unit so as to render a difference between the reference signal and the comparison target signal equal to zero.

In the present invention, the bits are classified into the high order bits and the low order bits in the D/A converter. For example, 5 bits are included in the high order bits in the case of the 19-bit D/A converter. The D/A converter includes the current sources whose number is equal to the number of the decoded high order bits. Moreover, the D/A converter includes the bit current sources whose number corresponding to the bit number of the low order bits and the auxiliary least significant current source for the auxiliary bit assigned an identical weight to the least significant bit. In this D/A converter, the value (the reference signal) obtained by adding the output current obtained when turning all the low order bits on to the output current obtained when turning the auxiliary bit on is compared with one of the first bit current sources of the high order bits, and the digital code to be inputted to the linearity correction D/A converter unit is determined so as to render the difference between the reference signal and the bit current source equal to zero. This processing is executed for all the current sources used to constitute the high order bits. In this way, the first D/A converter units of the high order bits are calibrated in conformity to the second D/A converter units of the low order bits whereby the linearity is assured while avoiding discontinuation of the analog values after the D/A conversion.

The digital-to-analog converter may further include a temperature dependent signal extraction unit configured to detect a signal which changes depending on a temperature. In the above digital-to-analog converter, the correction digital-to-analog converter part may include a temperature compensation digital-to-analog converter unit, and when a temperature changes to a different temperature from a predetermined temperature with the temperature dependent signal extraction unit zero-adjusted at the predetermined temperature, the control section may compare a comparison target signal with a reference signal where the comparison target signal is a current value of one of the first bit current sources and the reference signal is a current value obtained by adding an output current from the auxiliary least significant current source to a total output current from the lower-ordered second bit current sources all turned on, and compensate for the current value of the first bit current source at the different temperature by setting a digital code to the linearity correction digital-to-analog converter unit such that a difference between the reference signal and the comparison target signal is zero.

In the present invention, the D/A converter is provided with the temperature dependent signal extraction unit to detect the temperature change and extract the voltage corresponding to the temperature change, thereby obtaining the attenuation value corresponding to a certain temperature to be set to the temperature compensation D/A converter unit. By obtaining the attenuation value in the range from −1 to +1 relative to the change in the voltage signal by using the temperature compensation D/A converter unit, the output variation is returned to zero. In this way, it is possible to eliminate variation in the D/A conversion value even if there is variation in the temperature. Moreover, by setting up the digital code for the temperature compensation D/A converter unit at the time of shipment, the compensation for the temperature can be performed at any time in the apparatus mounted with the D/A converter.

In the above D/A converter, the error detection processing section may include a data reception unit, an alternating-current amplification unit, a synchronous rectification unit, a comparison unit, and a code generation unit, and the control section may input the reference signal and the comparison target signal alternately through the data reception unit to generate an alternating-current signal, cause the alternating-current amplification unit to amplify the alternating-current signal, cause the synchronous rectification unit to convert the alternating-current signal into a direct-current signal corresponding to the difference between the reference signal and the comparison target signal, cause the comparison unit to judge whether the comparison target signal is larger or smaller than the reference signal based on the direct-current signal, and cause the code generation unit to generate a digital code so as to render the comparison target signal smaller when the comparison target signal is larger to render the comparison target signal larger when the comparison target signal is smaller.

In the present invention, the error detection processing section is provided to compare the reference signal with the comparison target signal so as to render the difference equal to zero. The error detection processing section extracts only the difference by generating the alternating-current signal by alternately inputting the reference signal and the comparison target signal, generates the digital code so as to render the difference equal to zero, and sets the digital code to the compensation D/A converter units. In this way, it is possible to eliminate the direct-current component and to detect the minute difference accurately without causing saturation of the signal when amplifying and detecting the difference. Hence it is possible to calculate an accurate correction amount.

DESCRIPTION OF THE PREFERRED EMBODIMENTS

Now, an embodiment of the present invention will be described below with reference to the accompanying drawings.

First of all, a configuration of a multi-column electron beam exposure apparatus will be described. Next, a configuration of a D/A converter will be described. Thereafter, types of correction intended in this embodiment will be described, and then self calibration of the D/A converter in which the correction is executed will be described. Lastly, verification of data to be transmitted to the D/A converter will be described.

Figure 1:
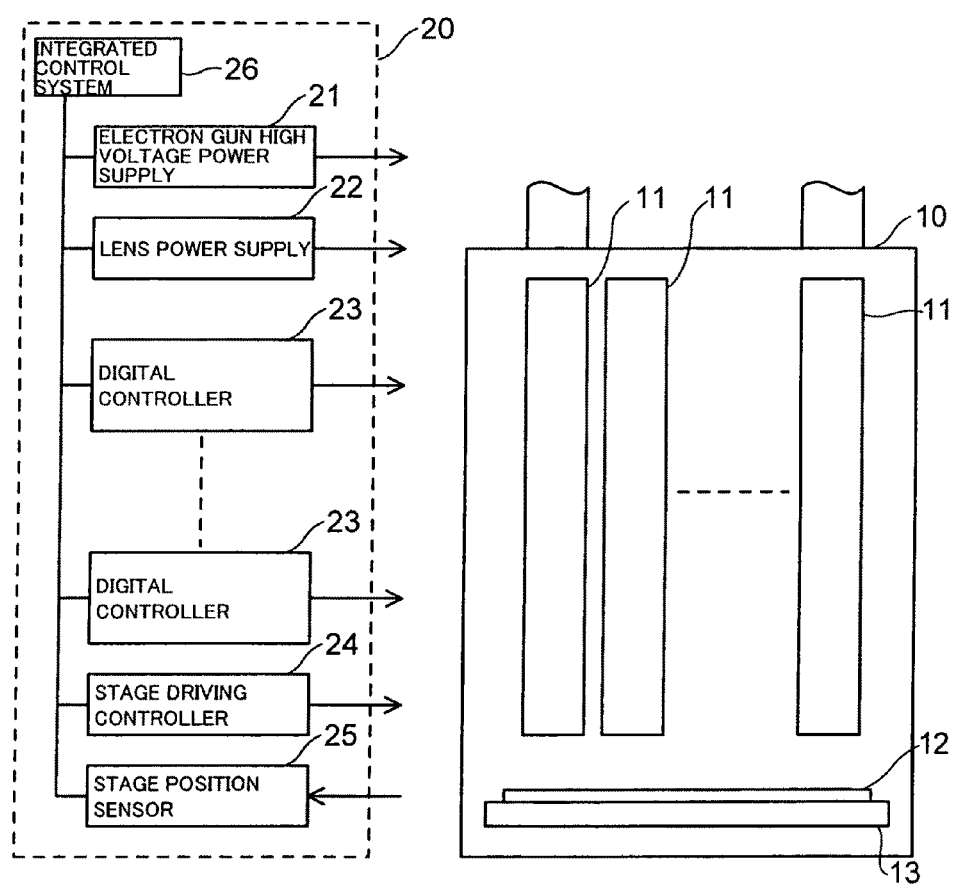
FIG. 1 is a configuration diagram of a multi-column electron beam exposure apparatus according to the present invention.

FIG. 1 is a schematic configuration diagram of multi-column electron beam exposure apparatus of this embodiment. The multi-column electron beam exposure apparatus is divided broadly into an electron beam column 10 and a control section 20 which controls the electron beam column 10. Here, the entirety of the electron beam column 10 is formed by including multiple, for example, 16 column cells 11, all of which are the same. Each of the column cells 11 includes the same units to be described later. A wafer stage 13 loaded with, for example, a 300 mm wafer 12 is disposed below the column cells 11.

The control section 20 includes an electron gun high voltage power supply 21, a lens power supply 22, digital controllers 23, a stage driving controller 24, and a stage position sensor 25. The electron gun high voltage power supply 21 supplies power for driving electron guns of the respective column cells 11 in the electron beam column 10. The lens power supply 22 supplies power for driving electromagnetic lenses of the respective column cells 11 in the electron beam column 10. Each of the digital controllers 23 is an electrical circuit for controlling parts of the corresponding column cell 11 and configured to output a high speed deflection output and the like. The digital controllers 23 are provided in the same number as the number of the column cells 11. The stage driving controller 24 moves the wafer stage 13 on the basis of positional information from the stage position sensor 25 so that a desired position on the wafer 12 is irradiated with an electron beam. The constituents 21 to 25 described above are controlled integrally by an integrated control system 26 such as a workstation.

In the multi-column electron beam exposure apparatus, each of the column cells 11 is formed of the same column unit.

Figure 2:
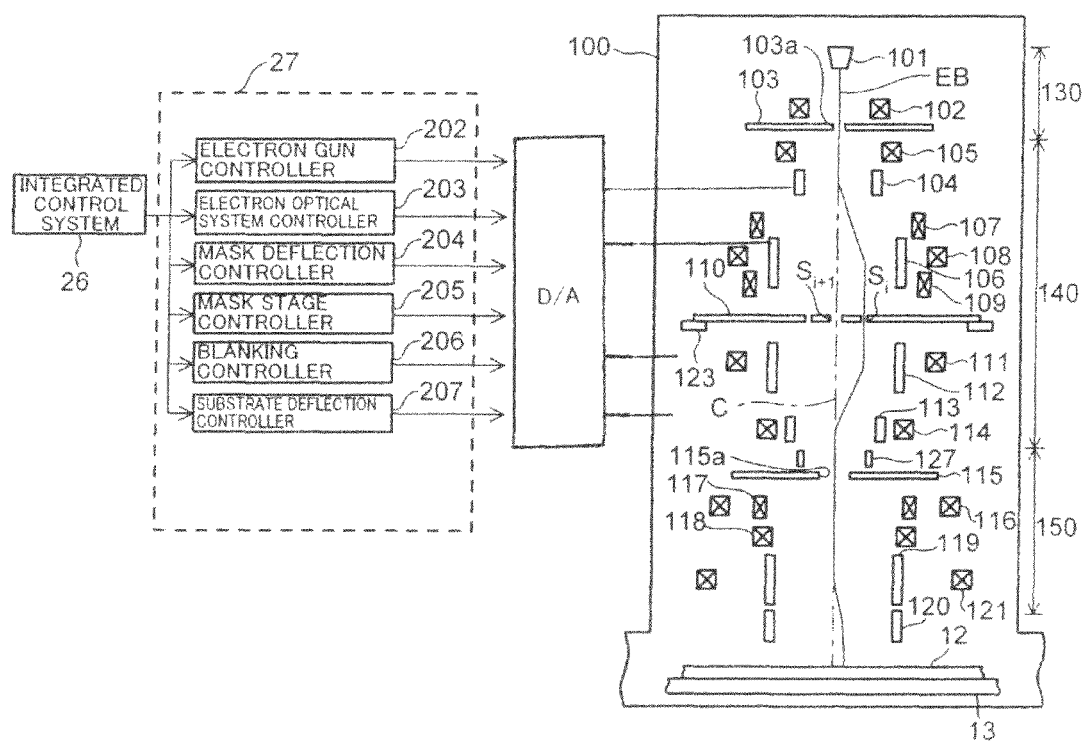
FIG. 2 is a configuration diagram of a column cell of the exposure apparatus shown in FIG. 1.

FIG. 2 is a configuration diagram of each column cell 11 used in the multi-column electron beam exposure apparatus.

Each column cell 11 is divided broadly into an exposure unit 100 and a column cell controller 27 configured to control the exposure unit 100, and a digital-to-analog (D/A) converter provided between the column cell controller 27 and the exposure unit 100. Here, the exposure unit 100 includes an electron beam generation section 130, a mask deflection section 140, and a substrate deflection section 150.

In the electron beam generation section 130, an electron beam EB generated by an electron gun 101 is subjected to a convergence action by a first electromagnetic lens 102, and is passed through a rectangular aperture 103a of a beam shaping mask 103 whereby a cross section of the electron beam EB is shaped into a rectangle.

Thereafter, the electron beam EB is focused on an exposure mask 110 by use of a second electromagnetic lens 105 of the mask deflection section 140. Then, the electron beam EB is deflected into a specific pattern S formed on the exposure mask 110 by use of first and second electrostatic deflectors 104 and 106, and a cross-sectional shape thereof is shaped into the shape of the pattern S.

While the exposure mask 110 is fixed to a mask stage 123, the mask stage 123 is movable within a horizontal plane. When the pattern S located in a position exceeding a deflection range (a beam deflection region) of the first and second electrostatic deflectors 104 and 106 is used, the pattern S is moved into the beam deflection region by moving the mask stage 123.

Third and fourth electromagnetic lenses 108 and 111 located above and below the exposure mask 110, respectively, assume a role of focusing the electron beam EB on the substrate by adjusting amounts of currents thereof.

The electron beam EB passed through the exposure mask 110 is swung back to an optical axis C by deflecting actions of third and fourth electrostatic deflectors 112 and 113, and is then reduced in size by use of a fifth electromagnetic lens 114.

The mask deflection section 140 is provided with first and second correction coils 107 and 109. Beam deflection aberrations caused by the first to fourth electrostatic deflectors 104, 106, 112, and 113 are corrected by these coils 107 and 109.

Thereafter, the electron beam EB is passed through an aperture 115a of a masking shield 115 which constitutes the substrate deflection section 150, and is then projected on the substrate by first and second electromagnetic projection lenses 116 and 121. In this way, an image of the pattern on the exposure mask 110 is transferred to the substrate at a predetermined reduction ratio, for example, 1/10.

The substrate deflection section 150 is provided with a fifth electrostatic deflector 119 and a sixth electrostatic deflector 120. The electron beam EB is deflected by the deflectors 119 and 120 and the image of the pattern on the exposure mask is projected to a predetermined position on the substrate.

Further, the substrate deflection section 150 is provided with third and fourth correction coils 117 and 118 for correcting deflection aberration of the electron beam EB on the substrate.

The column cell controller 27 includes an electron gun controller 202, an electron optical system controller 203, a mask deflection controller 204, a mask stage controller 205, a blanking controller 206, and a substrate deflection controller 207. The electron gun controller 202 controls the electron gun 101 to regulate an accelerating voltage of the electron beam EB, a beam emitting condition, and the like. The electron optical system controller 203 controls amounts of currents to be applied to the electromagnetic lenses 102, 105, 108, 111, 114, 116 and 121, and the like, thereby adjusting magnification, a focal point, and the like of an electron optical system including these electromagnetic lenses. The blanking controller 206 deflects, onto the masking shield 115, the electron beam EB generated before the start of exposure by controlling a voltage applied to a blanking electrode 127, thereby prevents the substrate from being irradiated with the electron beam EB before the exposure.

The substrate deflection controller 207 controls a voltage applied to the fifth electrostatic deflector 119 and a voltage applied to the sixth electrostatic deflector 120 so that the electron beam EB is deflected to the predetermined position on the substrate. The constituents 202 to 207 described above are integrally controlled by the integrated control system 26 such as a workstation.

(Configuration of D/A Converter for Exposure Apparatus)

Figure 3:
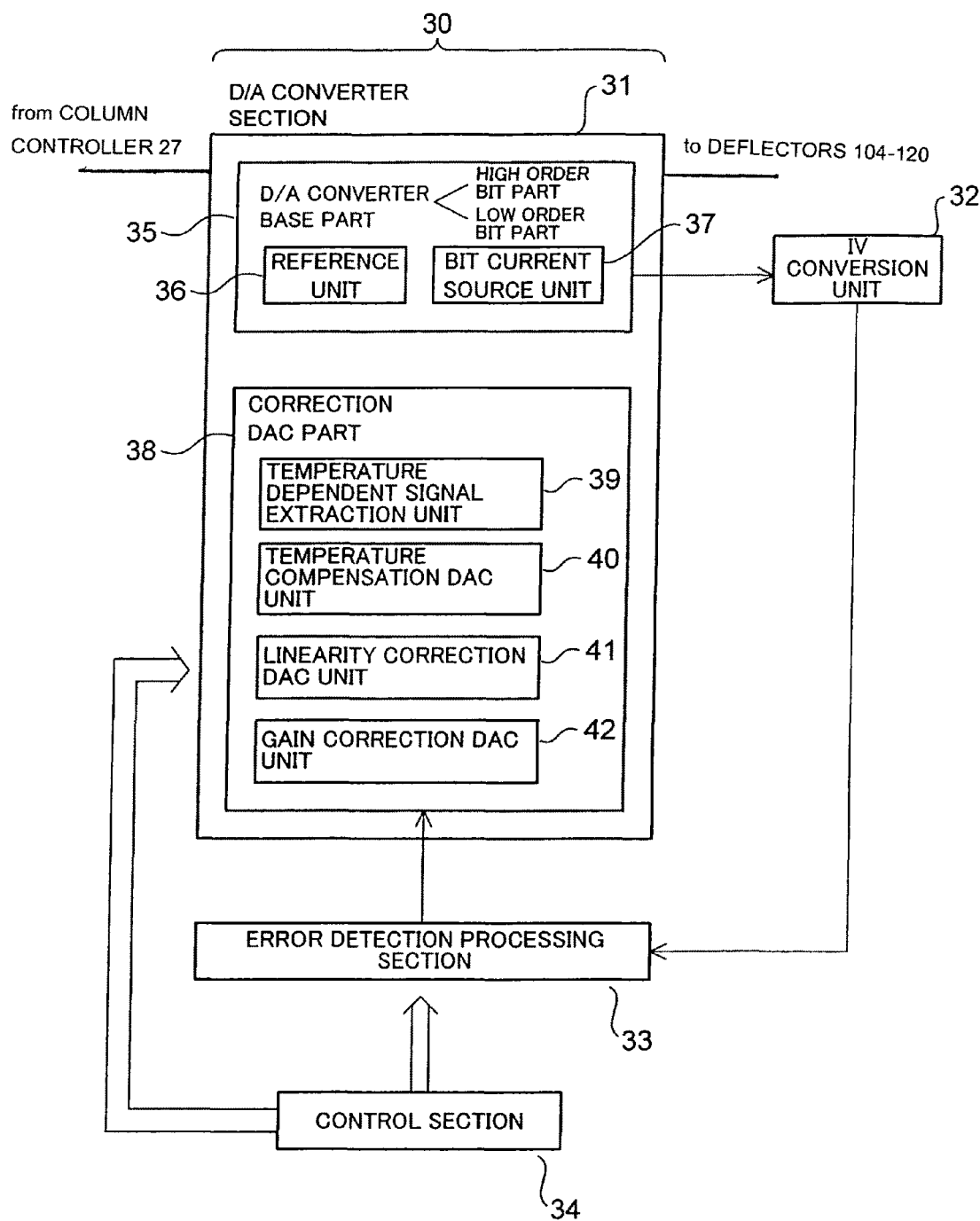
FIG. 3 is a block diagram showing an overall configuration of a D/A converter according to the present invention.

Next, a D/A converter to be used for the deflectors in the exposure apparatus will be described. The D/A converter converts exposure data into analog signals and supplies the signals to the deflectors described above. FIG. 3 is a block diagram showing an overall configuration of a D/A converter 30 according to this embodiment. The D/A converter 30 receives the digital data from the column cell controller 27 and outputs analog deflection signals to the electrostatic deflectors 104-120 in the exposure unit 100.

The D/A converter 30 is divided broadly into a D/A converter section 31, an error detection processing section 33, and a control section 34. The D/A converter section 31 is divided broadly into a D/A converter base part 35 and a correction DAC part 38. The D/A converter base part 35 includes a reference unit 36 configured to generate a current serving as a reference and a bit current source unit 37 for generating a current which corresponds to a digital code. A bit current source of the bit current source unit 37 is a current source which has direct influence on the exposure data. The correction DAC part 38 includes a temperature dependent signal extraction unit 39, a temperature compensation DAC unit 40, a linearity correction DAC unit 41, and a gain correction DAC unit 42, and is configured to correct a current value and the like of the current source. The correction D/A converter units are provided respectively for multiple types of correction. The types of correction will be described later.

The error detection processing section 33 detects an error between a reference signal and a detection target signal, and performs processing so as to render the error equal to zero. For example, the error detection processing section 33 detects an error of linearity, and generates a value for correction to be set into the linearity correction DAC unit 41 of the D/A converter to correct the current value of the bit current source.

The control section 34 controls the D/A converter section 31 and the error detection processing section 33, and acquires the optimum amount of correction.

Figure 4:
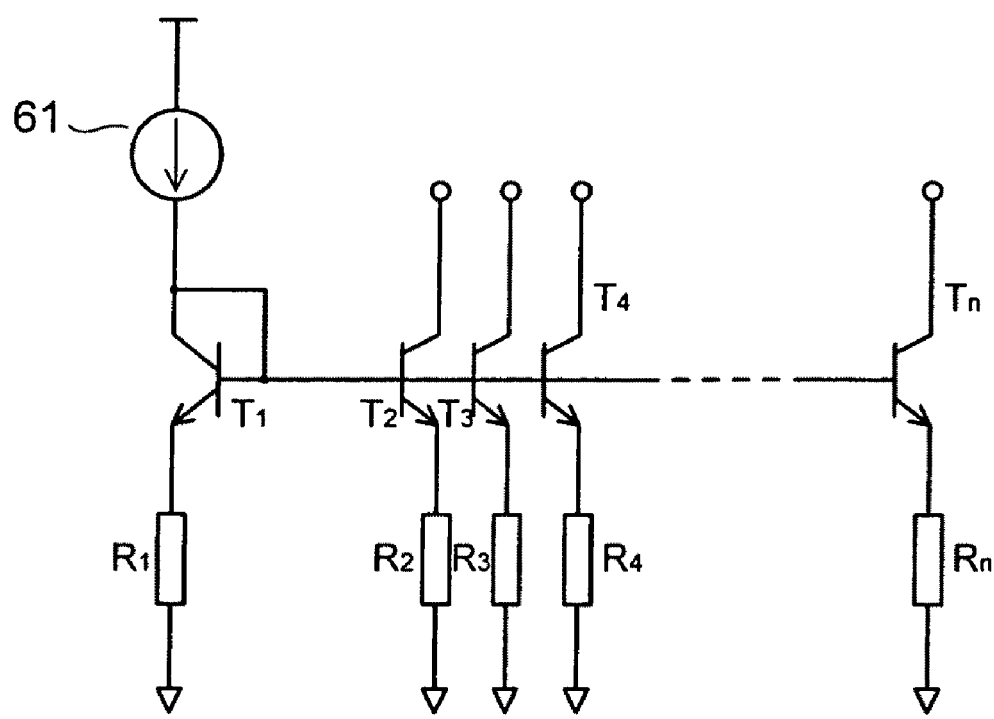
FIG. 4 is a view showing an example of a configuration of a current source unit for supplying currents to the D/A converter.

FIG. 4 is a configuration diagram showing an example of a current source unit for supplying currents to the D/A converter in accordance with a reference method. Such current sources for supplying currents to the D/A converter base unit form a mirror circuit, and supply multiple currents of the current sources on the basis of a highly accurate current source 61 supplying a current from the outside. When the current sources are arranged in parallel, heat noises and the like generated in each of the current sources are reduced to $1/\sqrt{n}$, where n is the number of the current sources arranged in parallel. Hence it is possible to reduce the amount of error.

Internal resistance of the current source in the mirror circuit has a temperature coefficient around 300 ppm/° C. at the highest accuracy. Accordingly, a variation in the temperature around 3% brings about variation of 10 ppm. In addition, 31 bit current sources used to constitute a segment unit for 5 bits generate variation around 300 ppm. In order to achieve resolution equivalent to 19 bits, only a variation around 2 ppm is allowable. For this reason, various correcting operations are carried out to assure the resolution of 2 ppm in this embodiment.

Each of the correction D/A converter units adjusts manufacturing errors and manufacturing variations of respective devices constituting the D/A converter and corrects temperature drifts or aged (time) variation. In this embodiment, correction targets include gain calibration for adjusting an output current value, calibration and correction of linearity, zero-adjustment of a positive temperature dependent signal, zero-adjustment of a negative temperature dependent signal, and temperature compensation.

The gain calibration is intended for adjusting the output current value while the calibration and correction of linearity are intended for calibrating the current value of the bit current source thereby correcting the aged variation of the bit current source. The zero-adjustment of the positive temperature dependent signal sets a positive temperature dependent signal to zero and the zero-adjustment of the negative temperature dependent signal sets a negative temperature dependent signal to zero. Meanwhile, the temperature compensation attenuates a signal component depending on the temperature to avoid an output value of the D/A converter from being influenced by the temperature.

The calibration of linearity and the temperature compensation will be described below.

(1) Concerning the Calibration of Linearity

First, the basic concept of the calibration of linearity will be described. In the D/A converter of this embodiment, a high order bit D/A converter section and a low-order bit D/A converter section are provided separately in order to reduce glitches. Here, the number of the current sources (the bit current sources) used for the high order bits is equal to the number of bits obtained by decoding the high order bits in accordance with a segment method. For example, when higher-order 5 bits of a 19-bit D/A converter are defined as high order bits and lower-order 14 bits thereof are defined as low order bits, so that the 5 high order bits use 31 pieces of the current sources all of which are the same. The 14 low order bits have stable values and therefore uses an R-2R ladder circuit structure having 14 bit current sources.

Figure 5:
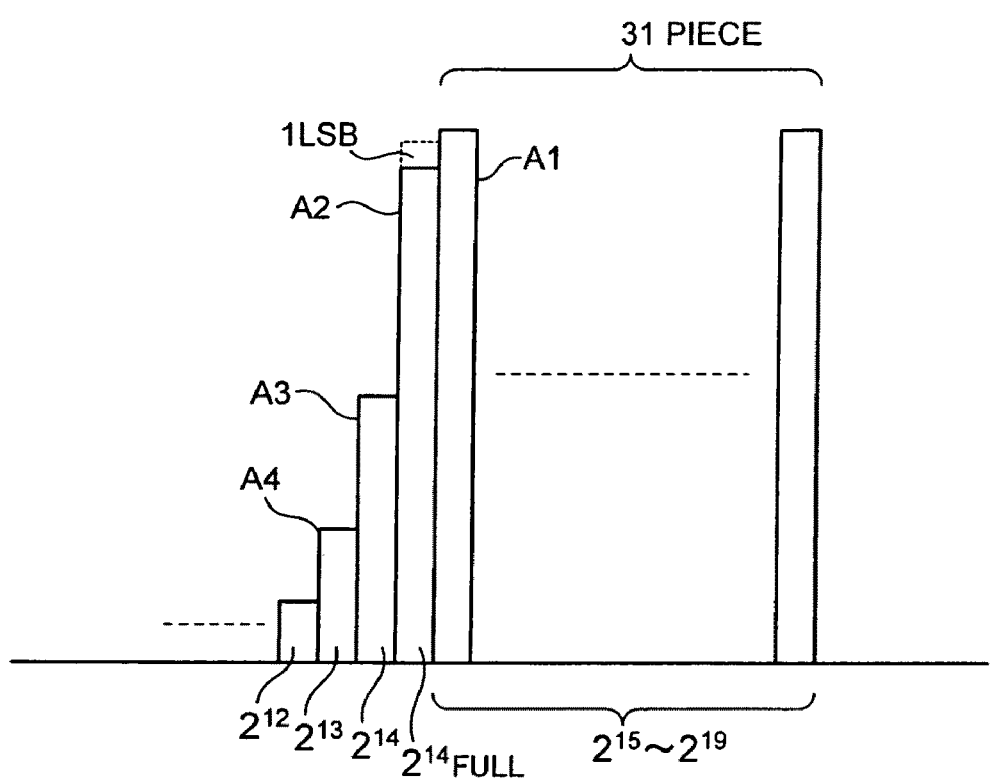
FIG. 5 is a view showing relations between bits and output values.

In the D/A converter having the above configuration, a current value obtained when 15 bit is turned on must be equal to a current value (hereinafter also referred to as a reference signal) obtained by adding a current value of one LSB (least significant bit) to an output current value obtained when all the low order 14 bits are turned on (which is also called a 14-bit full output). FIG. 5 shows such a relationship between bits and output values. As shown in FIG. 5, a current value A3 obtained when 14 bit is turned on is equal to ½ of a current value Al obtained when 15 bit is turned on. Similarly, a current value A4 obtained when 13 bit is turned on is equal to ½ of the current value A3 obtained when 14 bit is turned on. Theoretically, the current value Al obtained when 15 bit is turned on becomes equal to the reference value obtained by adding the current value of one LSB (a portion indicated with a broken line in FIG. 5) to a current value A2 obtained when all the lower-order 14 bits are turned on.

Nevertheless, the values of the current sources may vary due to aged variation. As a result, the values of the current sources may not be equal to the reference value, and an error may occur. When the error occurs, the error should be offset by adjusting the values of the current sources used in the segment unit by the amount equivalent to the error. For example, when the segment unit is 5 bits, comparison and calibration with respect to the reference value is executed for 31 times. The linearity is assured by eliminating the error between the reference value and all the current sources used to constitute the segment.

In this embodiment, a bit corresponding to the LSB is provided as an auxiliary bit, and the error in the linearity can be eliminated by comparing the bit current sources used in the segment unit with the bit current sources used in the low order bits, and by supplying the digital code to the linearity correction D/A converter unit 41 of the correction D/A converter part 38. Specifically, the current value of a certain bit current source of the current sources used in the segment unit is defined as a comparison target signal while the current obtained by adding the output current of the auxiliary bit corresponding to the LSB to the output current obtained when all the low order bits are turned on is defined as a reference signal. Then, this reference signal is compared with the comparison target signal, and the digital code is supplied to the linearity correction D/A converter unit 41 such that the difference becomes zero.

The calibration of linearity is executed once every week, for example. This calibration interval may be set appropriately to maintain the linearity of 2 ppm in spite of the variations due to aged (time) variation of components constituting the apparatus.

While the linearity is assured by carrying out the calibration of linearity, the gain will also vary. For example, assuming that the resolution of the calibration of linearity is $\frac{1}{16}$LSB, the gain (an analog current value after D/A conversion) varies in the amount expressed by ($\frac{1}{16}$)×31=2 LSB at the maximum after executing 31 sessions of the calibration of linearity. Thus, the exposure apparatus of the present invention performs the following adjustment by means of laser length measurement of the position of the stage in order to compensate the variation of the gain.

First, a voltage is applied to deflect the electron beam by a predetermined distance from an optical axis toward a predetermined marking position. Next, a stage position is moved to align the optical axis with the predetermined marking position. As a result, an amount showing the displacement between the position irradiated with the electron beam and the marking position is supplied to the gain correction D/A converter unit 42 as a gain correction amount.

(2) Concerning the Temperature Compensation

Next, the temperature compensation will be described. Properties of the devices constituting the D/A converter change depending on a change in the temperature, which is attributable to an irradiation performance of the electron beam and the like. This is because a change of properties causes a change in the values of the current sources or the like. Therefore, correction is carried out to reduce a variation in an output value in D/A conversion even when there is a change in the temperature.

In this embodiment, a voltage signal corresponding to the change in the temperature is detected by the temperature dependent signal extraction unit 39.

In the execution of the temperature compensation, zero-adjustment of the temperature dependent signal extraction unit 39 is conducted first. In the zero adjustment, a temperature dependent signal outputted from the temperature dependent signal extraction unit 39 at a reference temperature (such as 23° C.) is adjusted to be "0". [V] Accordingly, a digital code is supplied to a temperature dependent signal adjustment D/A converter unit such that the voltage (the temperature dependent signal) detected at the reference temperature becomes zero. A detected voltage and 0 [V] are alternately inputted to the error detection processing section 33, and the digital code to be supplied to the temperature dependent signal adjustment D/A converter unit is adjusted such that the difference therebetween becomes zero.

Figure 6:
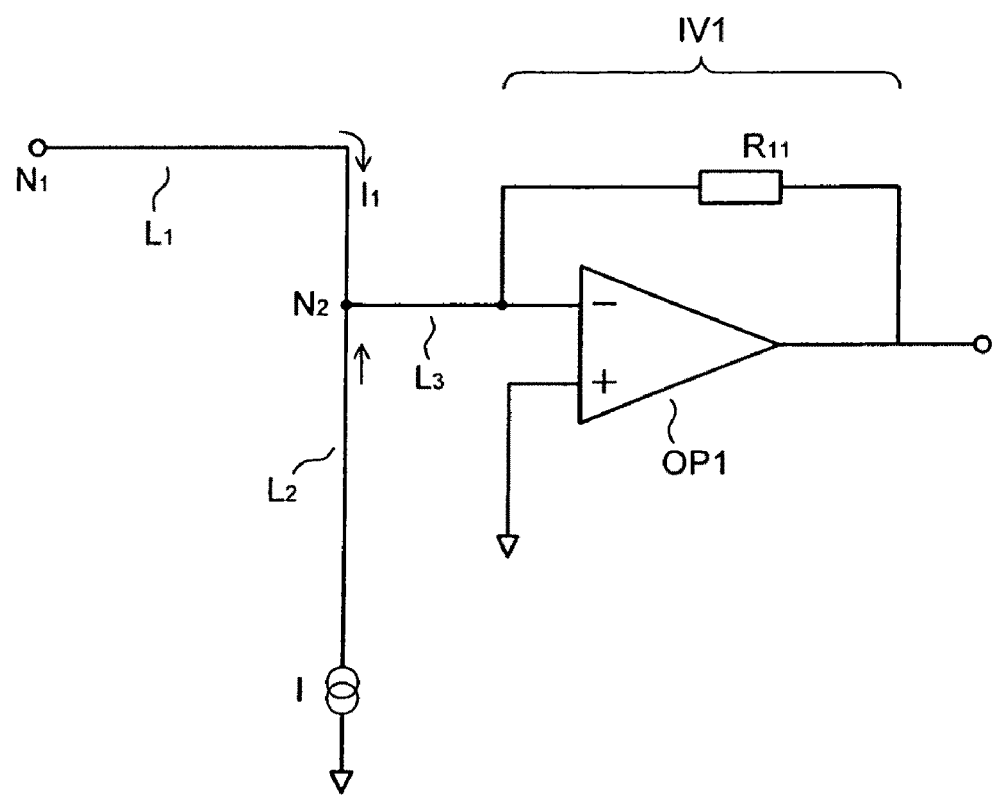
FIG. 6 is a circuit configuration diagram showing an example of a temperature dependent signal extraction unit.

FIG. 6 is a circuit configuration diagram showing an example of the temperature dependent signal extraction unit 39. The voltage variation corresponding to the change in the temperature is extracted by use of a resistor whose variation in a resistance value with respect to temperature is known. For example, a line L1 between nodes N1 and N2 in FIG. 6 is formed by use of aluminum. A line L3 connects the node N2 and a negative terminal of an operational amplifier OP1. A current source I is connected between a ground and the node N2 and a precise current is fed toward the node N2.

Aluminum is known to have change of the resistance value depending on a temperature at a rate of 0.3%/° C. Therefore, the value of the current to be supplied to the node N1 changes depending on a temperature coefficient of the line L1. Assuming that both of the current supplied to the node N1 and the current value of the current source I are 1 mA, a current corresponding to a change component in a current value I1 attributable to the change in the temperature flows into the line L3. This current is converted into a voltage by use of an IV conversion circuit IV1 by using a relation of 0.4 V/° C., for example.

After extracting the temperature dependent signal and detecting the change in voltage, the value of the current source is adjusted in response to this voltage. After carrying out the linearity calibration, calibration similar to the linearity calibration is carried out to obtain an attenuation amount to be set to the temperature compensation D/A converter unit 40, the amount corresponding to the temperature dependent signal.

For example, calibration of the bit current source is executed similarly to the linearity calibration in a state where the temperature rises by 5° C. from the reference temperature (such as 23° C.). Specifically, the current value of a certain bit current source out of the current sources used in the segment unit is defined as the comparison target signal while the current obtained by adding the output current of the auxiliary bit corresponding to the LSB to the output current obtained when turning all the low order bits on is defined as the reference signal. Then, this reference signal is compared with the comparison target signal and the digital code is supplied to the temperature compensation D/A converter unit 40 such that the difference between them becomes zero. The value of the digital code corresponds to a temperature compensation attenuation amount. The digital code generated herein corresponds to the case of the rise in the temperature by 5° C. from the reference temperature. Alternatively, the digital code for another change in the temperature may be calculated as a linear range of a change in the value of the digital code according to the change in the temperature.

(3) Error Detection Processing Section

Next, the error detection processing section configured to detect error in the current sources used for constituting the segment unit for the high order bits will be described.

Figure 7:
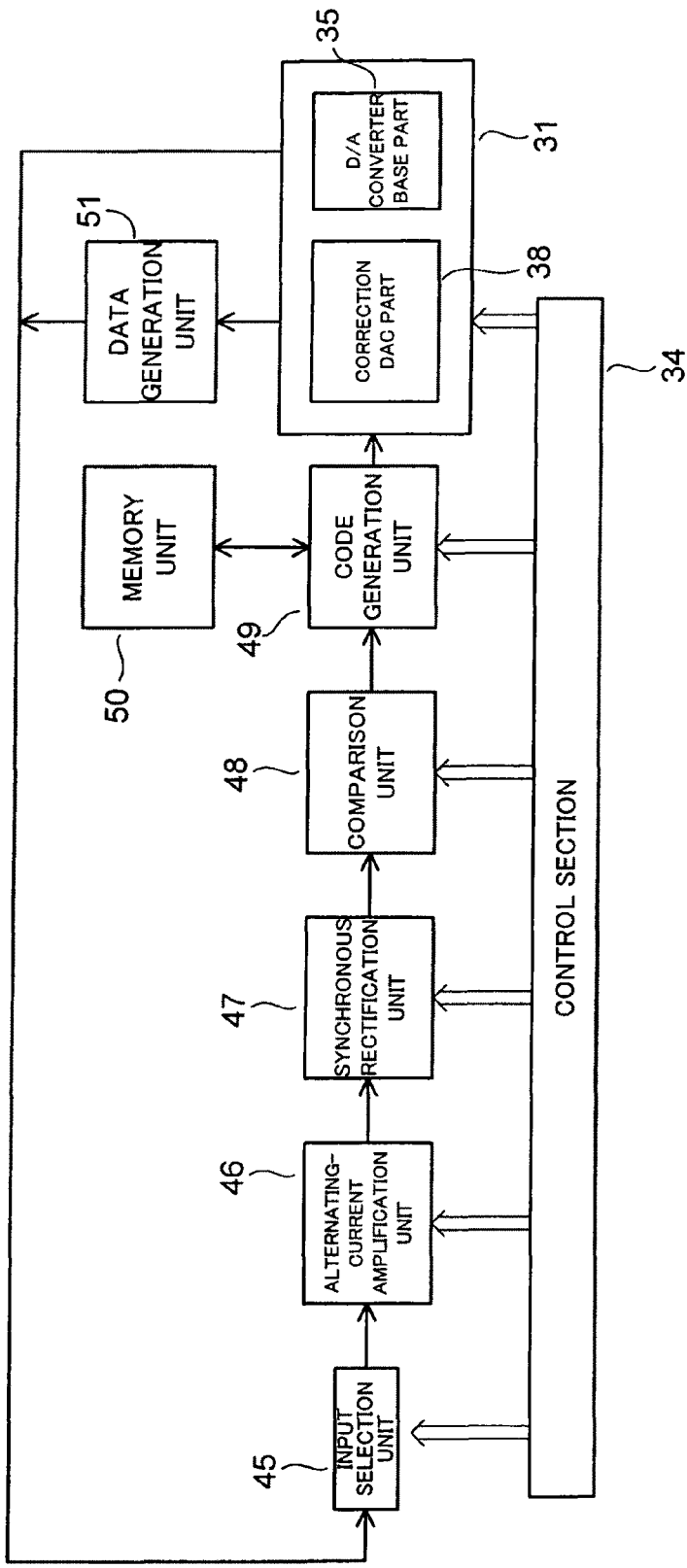
FIG. 7 is a block diagram showing an error detection processing section of the D/A converter shown in FIG. 3.
Figure 8:
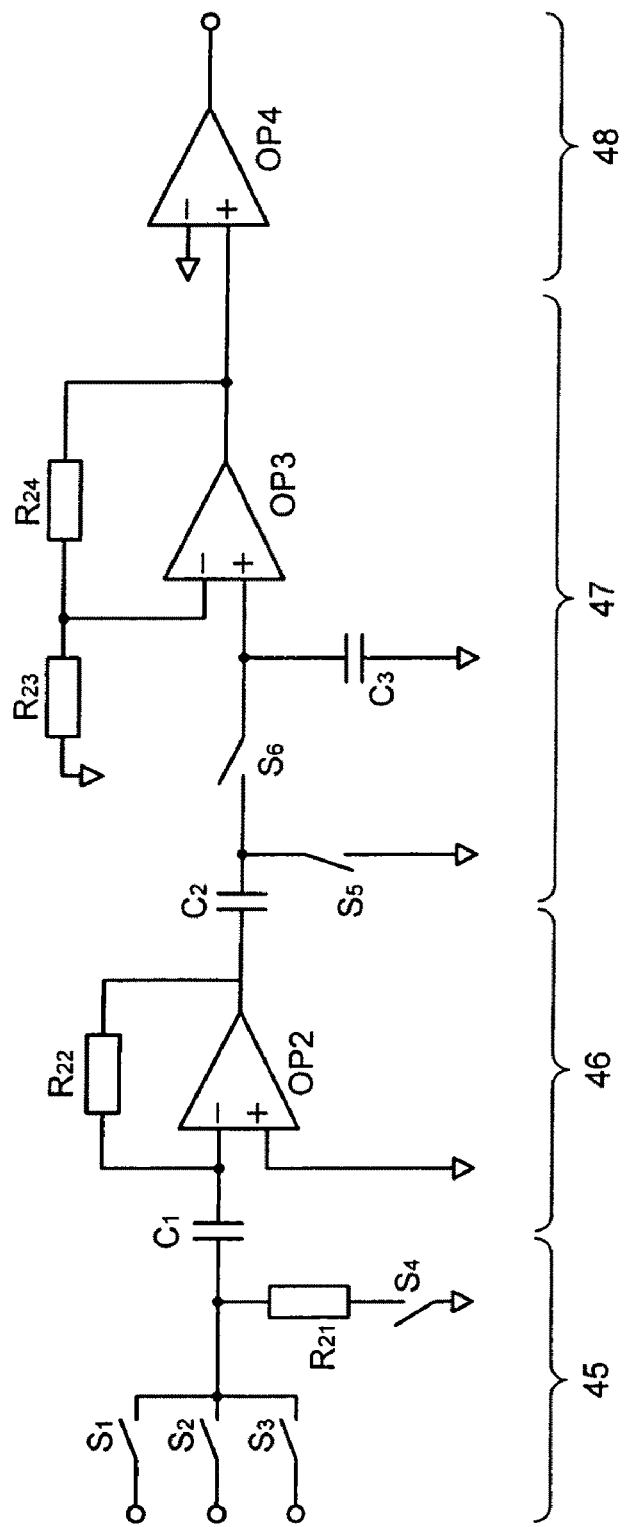
FIG. 8 is a circuit configuration diagram showing an example of the error detection processing section of the D/A converter shown in FIG. 3.

FIG. 7 is a block configuration diagram showing an outline of the error detection processing section 33. Meanwhile, FIG. 8 is a circuit configuration diagram showing part of the error detection processing section 33. The error detection processing section 33 basically includes an input selection unit 45, an alternating-current amplification unit 46, a synchronous rectification unit 47, a comparison unit 48, a code generation unit 49, a memory unit 50, and a data generation unit 51.

The input selection unit 45 selects a signal to be used as a comparison target in response to a target of error detection.

The alternating-current amplification unit 46 performs amplification of an alternating-current signal which is generated by the data generation unit 51 and supplied from the input selection unit 45.

The synchronous rectification unit 47 converts an alternating-current signal, which corresponds to the error and is amplified by the alternating-current amplification unit 46, into a direct-current signal corresponding to the error.

The comparison unit 48 compares the comparison target signal with the reference signal. When the comparison unit 48 judges that the comparison target signal is larger than the reference signal, digital data is generated to reduce the value of the comparison target signal, and this operation is terminated when the comparison target signal becomes smaller than the reference signal. On the other hand, the digital data is generated to increase the value of the comparison target signal when the comparison target signal is judged to be smaller than the reference signal.

The code generation unit 49 includes an up/down (U/D) counter unit and a binary search unit, for example, and is configured to generate codes to be supplied to the correction D/A converter units. The U/D counter unit and the binary search unit generate correction data in accordance with the judgment by the comparison unit 48. The U/D counter unit reads data attached to the comparison target signal from the memory unit 50 and presets the data to the U/D counter, and then generates the correction data in accordance with the judgment by the comparison unit 48.

The data generation unit 51 is operated in the case of the linearity calibration to generate the reference signal and the comparison target signal alternately. This timing is set to 5 kHz, for example.

The correction data and the like generated by the error detection processing section are accumulated in the memory unit 50.

The control section 34 controls the input selection unit 45, the alternating-current amplification unit 46, the synchronous rectification unit 47, the comparison unit 48, the code generation unit 49, the data generation unit 51, and the correction DAC part 38, and generates the optimum codes to be supplied to the correction D/A converter units.

(Explanation of Operations)

Next, an operation of the error detection processing section 33 will be described by using the linearity calibration as an example.

In the input selection unit 45, a switch S1 for the linearity calibration is turned on to select an IV conversion output. By this selection, a signal D/A converted is inputted to the error detection processing section 33 via a data receiver (not shown).

The data generation unit 51 alternately generates the reference signal and the comparison target signal, and inputs the signals to the error detection processing section 33. Here, the reference signal is the value obtained by adding the value of the LSB to the 14-bit full output from the D/A converter base part 35, and the comparison target signal corresponds to the certain current source used in the segment unit.

The alternating-current signal is generated by use of the reference signal and the comparison target signal alternately inputted as noted above. The alternating-current signal is amplified by the alternating-current amplification unit 46. The error between the reference signal and the comparison target signal is as small as a nano-order. Accordingly, the error is amplified to, for example, a micro-order so that the comparison unit 48 can sufficiently compare the comparison target signal with the reference signal.

The amplified error component is converted by the synchronous rectification unit 47 into the direct-current signal corresponding to the error component.

Before starting a comparison operation, switches S5 and S6 are turned on to establish a short-circuited state of a capacitor C3. The comparison operation is started, and during a period when the reference signal is inputted, the switch S5 is turned on while the switch S6 is turned off to establish a hold state. Meanwhile, during a period when the comparison target signal is inputted, the switch S5 is turned off while the switch S6 is turned on to establish a sample state. An alternating-current change component is accumulated in the capacitor C3 by repeating the switching operations during the comparison operation, and is converted into a direct-current voltage.

Next, the values are compared by the comparison unit 48 and the correction data is generated by the U/D counter unit of the code generation unit 49 so that the error component becomes zero.

When the comparison target signal becomes larger than the reference signal, the U/D counter unit generates data causing the current value to reduce by an amount corresponding to the error component. For example, assuming that the linearity correction D/A converter unit 41 has 16-bit resolution and ±16 μA output, correction data "0000 0000 0000 0010" is generated when the error component is 1 nA.

The comparison unit 48 judges whether the comparison target signal is larger or smaller than the reference signal on the basis of the direct-current signal converted by the synchronous rectification unit 47. The comparison target signal is judged to be larger when the direct-current signal is positive, and the U/D counter unit of the code generation unit 49 generates the data causing the comparison target signal to be smaller.

The data is inputted again to the error detection processing section 33, and is compared with the reference signal. When the comparison target signal is judged to be smaller, the operation will be repeated until the comparison target signal is judged to be larger. When the comparison target signal is judged to be larger, the operation will be repeated until the comparison target signal is judged to be smaller.

Lastly, the data obtained by the code generation unit 49 is used as the value to be set to the linearity correction D/A converter unit 41 with respect to the comparison target signal.

The above processing is executed for all the current sources used for constituting the segment unit of the D/A converter. Further, the processing is executed for all the D/A converters used in the exposure apparatus.

Next, an operation of the error detection processing section 33 will be described by using the zero-adjustment of the temperature dependent signal as an example.

In the zero-adjustment of the temperature dependent signal, switches S2 and S4 in the input selection unit 45 of FIG. 8 are alternately turned on and off. The temperature dependent signal (the comparison target signal, for example, 0.4 V/° C.) extracted by the temperature dependent signal extraction unit 39 is inputted when the switch S2 is turned on. Meanwhile, ground potential (0 V) serving as the reference signal is inputted when the switch S4 is turned on.

The alternating-current signal is generated by the reference signal and the comparison target signal thus inputted, and the alternating-current signal is amplified by the alternating-current amplification unit 46. The amplified error component is converted by the synchronous rectification unit 47 into the direct-current signal corresponding to the error component.

Next, the values are compared by the comparison unit 48 and the correction data is generated by the code generation unit 49 so that this error component becomes zero.

The comparison unit 48 compares the direct-current signal converted by the synchronous rectification unit 47 with the reference value (0 V), i.e., the ground potential. The comparison target data is judged to be large when the direct-current signal is positive, and the data for reducing the amount of the comparison target data is generated by the code generation unit 49.

The data is inputted again to the error detection processing section 33, and is compared with the reference value.

Finally, the data obtained by the code generation unit 49 is used as the value to be set to a temperature dependent signal zero calibration D/A converter with respect to the comparison target signal.

Next, an operation of the error detection processing section 33 will be described by using the temperature compensation as an example.

In the input selection unit 45, the switch S1 for the temperature compensation is turned on to select the IV conversion output. By this selection, a signal D/A converted is inputted to the error detection processing section 33.

The data generation unit 51 alternately generates the reference signal and the comparison target signal, and inputs the signals to the error detection processing section 33. Here, the value of the reference signal is obtained by adding the value of the auxiliary bit corresponding to the LSB to the output value obtained when all of the bits (the number of comparison targets - 1) or less bits are turned on, and the comparison target signal corresponds to the current source of the comparison target bit.

The alternating-current signal is generated by the reference signal and the comparison target signal thus inputted, and the alternating-current signal is amplified by the alternating-current amplification unit 46. The amplified error component is converted by the synchronous rectification unit 47 into the direct-current signal corresponding to the error component.

Next, the values are compared by the comparison unit 48 and the correction data is generated by the code generation unit 49 so that this error component becomes zero. The correction data is inputted again to the error detection processing section 33, and is compared with the reference signal.

As described above, the operation by the error detection processing section 33 in the temperature compensation is the same as the operation in the linearity calibration. However, the result of the operation turns out to be the attenuation amount for the temperature compensation to be inputted to the temperature compensation D/A converter unit 40 as the digital code.

As described above, in this embodiment, the error detection processing section 33 is provided to compare the reference signal with the comparison target signal so that the difference between them becomes zero. The error detection processing section 33 extracts only the difference by alternately inputting the reference signal and the comparison target signal and generating the alternating-current signal, generates the digital code, and supplies the digital code to the correction D/A converter units so as to render the difference equal to zero. In this way, it is possible to eliminate the direct-current signal component and to detect the minute difference accurately without causing saturation of the signal in the course of amplifying and detecting the difference. Hence it is possible to calculate the accurate correction amount.

(Logic Circuit Unit)

Next, a function to check whether digital data transmitted to the D/A converter section 31 are accurate or not will be described.

The exposure data stored in a storage unit (not shown) is converted into the digital data and is transmitted to the D/A converters. Before the data is transmitted to the D/A converter 31, the data with an error correcting function such as ECC or CRC are transmitted in order to assure accurate data transmission. In this embodiment, the D/A converter section 31 is provided with a function to judge accuracy of the transmitted data.

Figure 9A:
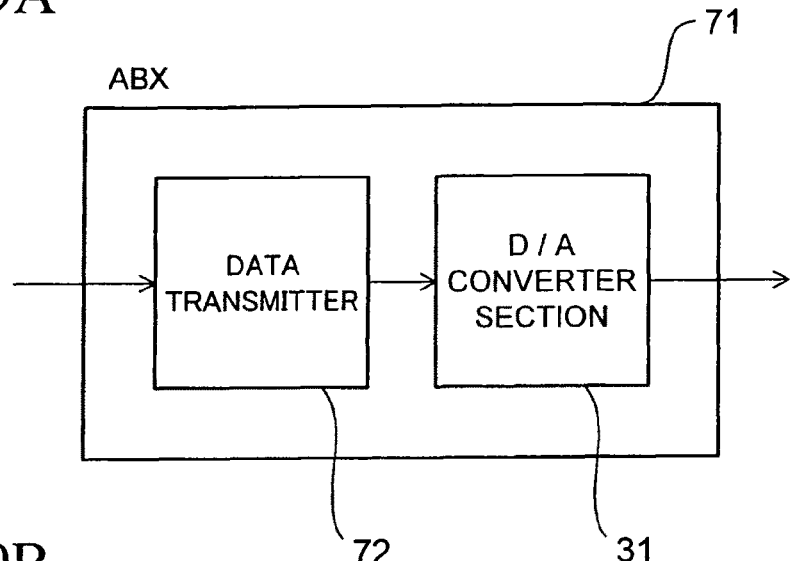
FIG. 9A to FIG. 9C are views for explaining a data transmission unit for data to be inputted to the D/A converter shown in FIG. 3.

FIG. 9A shows a data transmitter 72 and the D/A converter section 31 in an amplifier box ABX. The data transmitter 72 modulates the received data and transmits the data to the D/A converter section 31. The D/A converter section 31 reproduces a clock by using the original data and the modulated data.

The column unit configured to generate the electron beam has a cylindrical shape having a diameter of 600 mm and a height of 1200 mm, for example. Several hundreds of 19-bit D/A converters are disposed around this column unit and the analog signal is serially transmitted to the column unit. Assuming that a transmission speed is set to 20 MHz and the number of bits is set to 24 bits, a speed for performing the serial transmission reaches 480 Mbps and it is therefore difficult to determine the timing.

To counter this, the data transmitter 72 modulates the data and transmits the initial data IDT and the modulated data MDT to the D/A converter section 31. The MDT signal is modulated in a manner that condition is inverted when the IDT signal is not changed. The D/A converter can reproduce the clock at 240 MHz by deriving exclusive OR from the initial data IDT and the modulated data MDT. Since the clock is reproduced inside the D/A converter unit as described above, the timing can be easily determined and thereby reliability of data reception is enhanced.

Figure 9B:
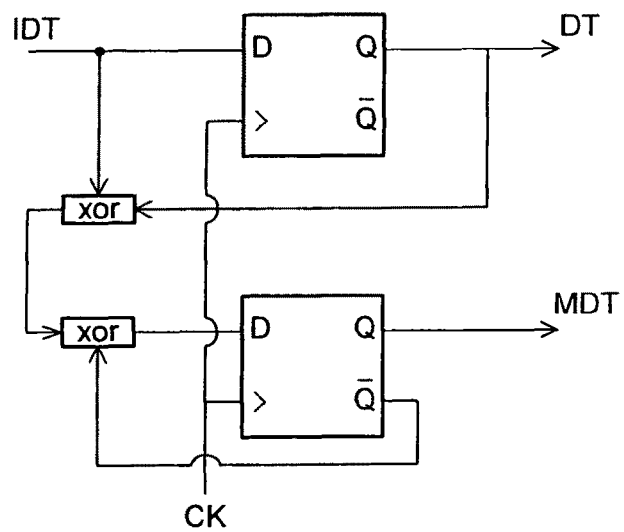
Figure 9C:
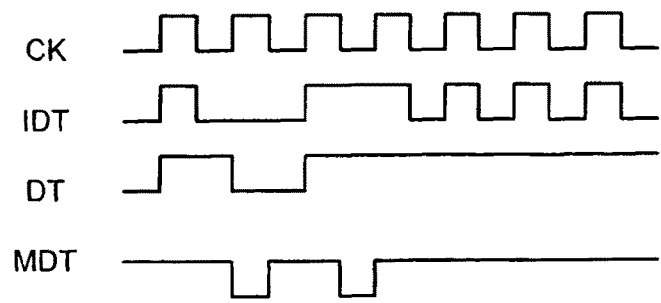

FIG. 9B is a view showing an example of a circuit used to subject the original data to the modulation, and FIG. 9C is a timing chart applicable thereto.

If the data to be inputted to the D/A converter section 31 are inaccurate, a drawing pattern is changed into an unintended form which causes manufacturing defects. Therefore, the data must retain high reliability. However, there are problems presently in the course of checking reliability of the received data, problems such as a necessity of verification by sending the received data back to the transmission unit and a long time required for checking the data.

To counter this, the received data is checked by applying a generator polynomial coding theory in this embodiment.

The data is coded by using a predetermined generator polynomial and a cyclic code is generated for check. For example, in the case of 16-bit data, a generator polynomial $X15+X14+1$ is a cyclic code generator polynomial. In this way, it is not necessary to send the received data back to the transmission unit and randomness of test data is also assured at the same time.

As described above, the exposure apparatus of this embodiment is provided with the D/A converter of the segment structure having the 19-bit resolution. In the D/A converter, the bits are classified into the high order bits and the low order bits. For example, 5 bits are included in the high order bits in the case of the 19-bit D/A converter. The D/A converter includes the current sources whose number is equal to the number of the decoded high order bits. Moreover, the D/A converter includes the bit current sources whose number corresponds to the bit number of the low order bits and an auxiliary least significant current source for the auxiliary bit which is assigned with the weight identical to the least significant bit. Here, the value (the reference signal) obtained by adding the output current when turning all the low order bits on to the output current when turning the auxiliary bit on is compared with one of the bit current source of the current sources used in the segment unit, and the digital code to be inputted to the linearity correction D/A converter unit 41 is determined so that the difference becomes zero. This processing is executed for all the current sources constituting the high order bits. In this way, the D/A converter units of the high order bits are calibrated in conformity to the D/A converter units of the low order bits whereby the linearity is assured while avoiding discontinuation of the analog values after the D/A conversion.

Moreover, the D/A converter of this embodiment is provided with the temperature compensation function. The D/A converter is provided with the temperature dependent signal extraction unit 39 to detect the voltage signal dependent on the temperature change inside the apparatus, performs the calibration similar to the linearity calibration on the bases of the voltage signal, and obtains the attenuation value corresponding to a certain temperature to be set to the temperature compensation D/A converter unit 40. By controlling the attenuation value by using the temperature compensation D/A converter unit 40, which corresponds to the change in the voltage signal, the output variation is returned to zero. In this way, it is possible to eliminate the variation in the D/A conversion value even if there is variation in the temperature. Moreover, by setting up the digital code for the temperature compensation D/A converter unit 40 at the time of shipment, the compensation for the temperature can be performed at any time in the apparatus mounted with the D/A converter.

The linearity calibration and the temperature compensation can be carried out even after the D/A converter is mounted on the apparatus. Accordingly, the D/A converter with high accuracy can be used for a long time.

Although the embodiment describes the case where the D/A converter is mounted on the multi-column electron beam exposure apparatus, the D/A converter can also be mounted on a single-column electron beam exposure apparatus as a matter of course.

Figure 10:
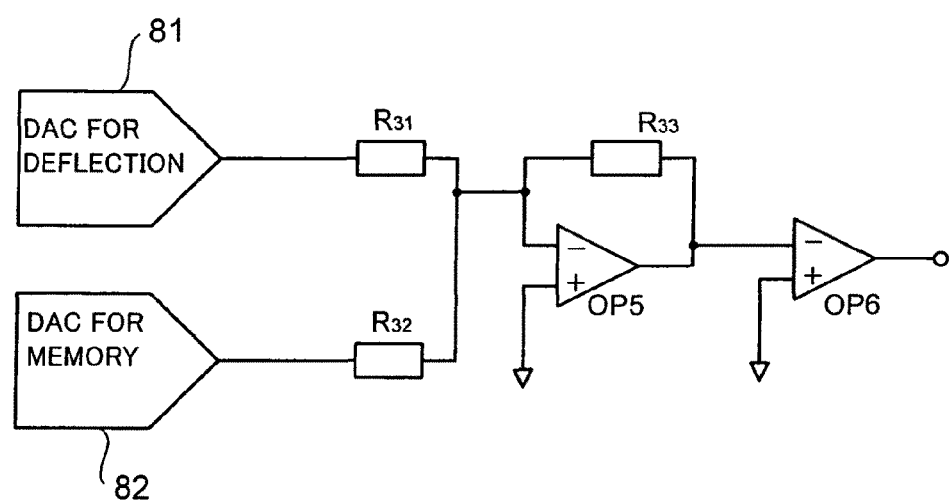
FIG. 10 is a view showing another example of error detection processing section.

Moreover, the embodiment describes the case where the difference between the reference signal and the comparison target signal is detected by using alternating-current amplification in the error detection processing. However, direct-current amplification can be used as well. FIG. 10 is a view showing an example of the direct-current amplification. A highly accurate operational amplifier OPS is used as an error amplification unit. A D/A converter 81 for deflection and a D/A converter 82 for memory are connected to an input terminal of the error amplification unit QP5. Further, a comparator OP6 is connected to an output terminal of the error amplification unit.

In an error detection processing section having such configuration, a full output of the 14 or less bits serving as a reference signal is firstly set to the D/A converter 81 for deflection. Next, the value of the D/A converter 82. for memory is controlled so that the output from the error amplification unit OP5 becomes zero. Subsequently, bit output data of a segment unit which is a comparison target are set to the D/A converter 81 for deflection. Next, a value of the D/A converter for correcting the current source of the bit output is acquired so that an error amplification output can be zero.

What is claimed is:
1. A digital-to-analog converter comprising:
a digital-to-analog converter base part including a first digital-to-analog converter unit configured to perform digital-to-analog conversion of high order bits and a second digital-to-analog converter unit configured to perform digital-to-analog conversion of low order bits, the second digital-to-analog converter unit being provided with an auxiliary bit assigned an identical weight to a least significant bit;
a correction digital-to-analog converter part configured to adjust a signal outputted from the first digital-to-analog converter unit in the digital-to-analog converter base part;

an error detection processing section configured to generate a digital code to be supplied to a correction digital-to-analog converter unit in the correction digital-to-analog converter part; and
a control section configured to control the digital-to-analog converter base part, the correction digital-to-analog converter part, and the error detection processing section, wherein
the first digital-to-analog converter unit includes first bit current sources whose number is equal to the number of the decoded high order bits,
the second digital-to-analog converter unit includes second bit current sources whose number corresponds to a bit number of the low order bits and an auxiliary least significant current source corresponding to the auxiliary bit, and
the control section compares a current value of one of the plurality of first bit current sources with a total current value of the second bit current sources in a lower order than the first bit current source, and corrects the current value of the first bit current source by causing the error detection processing section to generate the digital code supplied to the correction digital-to-analog converter unit when judging that the current value of the first bit current source changes.

2. The digital-to-analog converter according to claim 1, wherein
the correction digital-to-analog converter part includes a linearity correction digital-to-analog converter unit, and
the control section compares a comparison target signal with a reference signal where the comparison target signal is a current value of one of the first bit current sources and the reference signal is a current value obtained by adding an output current from the auxiliary least significant current source to a total output current from all the lower-ordered second bit current sources in ON state, and supplies a digital code to the linearity correction digital-to-analog converter unit so as to render a difference between the reference signal and the comparison target signal equal to zero.

3. The digital-to-analog converter according to claim 2, wherein
the error detection processing section includes a data reception unit, an alternating-current amplification unit, a synchronous rectification unit, a comparison unit, and a code generation unit, and
wherein the control section:
inputs the reference signal and the comparison target signal alternately through the data reception unit to generate an alternating-current signal;
causes the alternating-current amplification unit to amplify the alternating-current signal;
causes the synchronous rectification unit to convert the alternating-current signal into a direct-current signal corresponding to the difference between the reference signal and the comparison target signal;
causes the comparison unit to judge whether the comparison target signal is larger or smaller than the reference signal based on the direct-current signal; and
causes the code generation unit to generate a digital code which is used to minimize a difference between the comparison target signal and the reference signal.

4. The digital-to-analog converter according to claim 1, further comprising:
a temperature dependent signal extraction unit configured to detect a signal which changes depending on a temperature, wherein the correction digital-to-analog converter part includes a temperature compensation digital-to-analog converter unit, and when the temperature changes to a different temperature from a predetermined temperature after the temperature dependent signal extraction unit is zero-adjusted at the predetermined temperature, the control section compares a comparison target signal with a reference signal where the comparison target signal is a current value of one of the first bit current sources and the reference signal is a current value obtained by adding an output current from the auxiliary least significant current source to a total output current from the lower-ordered second bit current sources all turned ON, and compensates for the current value of the first bit current source at the different temperature by supplying a digital code to the linearity correction digital-to-analog converter unit such that a difference between the reference signal and the comparison target signal becomes zero.

5. The digital-to-analog converter according to claim 4, wherein the correction digital-to-analog converter part includes a temperature dependent signal adjustment digital-to-analog converter unit, and the zero-adjustment is performed by supplying a digital code to the temperature dependent signal adjustment digital-to-analog converter unit such that a temperature dependent signal varying with a temperature change detected by the temperature dependent signal extraction unit becomes 0[V] at a predetermined reference temperature.

6. The digital-to-analog converter according to claim 1, wherein the first current sources and the second current sources are connected in parallel.

7. The digital-to-analog converter according to claim 1, further comprising:

a digital data receiver; and a digital data transmitter provided in a stage preceding the digital data receiver, wherein the digital data transmitter generates modulated digital data whose state is inverted at each clock signal when digital data remain unchanged and is not inverted at each clock signal when the digital data is changed and the digital data receiver receives the digital data and the modulated digital data and reproduces a serial clock by using an exclusive logical sum of the digital data and the modulated digital data.

8. The digital-to-analog converter according to claim 7, wherein the digital data receiver includes a test data generation unit, and the received digital data is verified based on a generator polynomial generated by the test data generation unit.

9. An electron beam exposure apparatus having a plurality of column cells where each column cell comprises:

an exposure unit having an electron gun for generating an electron beam, a plurality of electromagnetic lens for focusing the electron beam, and a plurality of deflectors for deflecting the electron beam;

a column cell controller for controlling operations of the exposure unit; and a plurality of digital-to-analog converters connected between the column cell controller and the corresponding deflectors of the exposure unit;

wherein each digital-to-analog converter comprising:

a digital-to-analog converter base part including a first digital-to-analog converter unit configured to perform digital-to-analog conversion of high order bits and a second digital-to-analog converter unit configured to perform digital-to-analog conversion of low order bits, the second digital-to-analog converter unit being provided with an auxiliary bit assigned an identical weight to a least significant bit;

a correction digital-to-analog converter part configured to adjust a signal outputted from the first digital-to-analog converter unit in the digital-to-analog converter base part;

an error detection processing section configured to generate a digital code to be supplied to a correction digital-to-analog converter unit in the correction digital-to-analog converter part; and a control section configured to control the digital-to-analog converter base part, the correction digital-to-analog converter part, and the error detection processing section; wherein the first digital-to-analog converter unit includes first bit current sources whose number is equal to the number of the decoded high order bits;

the second digital-to-analog converter unit includes second bit current sources whose number corresponds to a bit number of the low order bits and an auxiliary least significant current source corresponding to the auxiliary bit; and the control section compares a current value of one of the plurality of first bit current sources with a total current value of the second bit current sources in a lower order than the first bit current source, and corrects the current value of the first bit current source by causing the error detection processing section to generate the digital code supplied to the correction digital-to-analog converter unit when judging that the current value of the first bit current source changes.

10. The electron beam exposure apparatus according to claim 9, wherein the correction digital-to-analog converter part includes a linearity correction digital-to-analog converter unit, and the control section compares a comparison target signal with a reference signal where the comparison target signal is a current value of one of the first bit current sources and the reference signal is a current value obtained by adding an output current from the auxiliary least significant current source to a total output current from all the lower-ordered second bit current sources in ON state, and supplies a digital code to the linearity correction digital-to-analog converter unit so as to render a difference between the reference signal and the comparison target signal equal to zero.

11. The electron beam exposure apparatus according to claim 10, wherein the error detection processing section includes a data reception unit, an alternating-current amplification unit, a synchronous rectification unit, a comparison unit, and a code generation unit, and wherein the control section:

inputs the reference signal and the comparison target signal alternately through the data reception unit to generate an alternating-current signal;

causes the alternating-current amplification unit to amplify the alternating-current signal;

causes the synchronous rectification unit to convert the alternating-current signal into a direct-current signal corresponding to the difference between the reference signal and the comparison target signal;

causes the comparison unit to judge whether the comparison target signal is larger or smaller than the reference signal based on the direct-current signal; and causes the code generation unit to generate a digital code which is used to minimize a difference between the comparison target signal and the reference signal.

12. The electron beam exposure apparatus according to claim 9, wherein the digital-to-analog converter further comprises:

a temperature dependent signal extraction unit configured to detect a signal which changes depending on a temperature, wherein the correction digital-to-analog converter part includes a temperature compensation digital-to-analog converter unit, and when the temperature changes to a different temperature from a predetermined temperature after the temperature dependent signal extraction unit is zero-adjusted at the predetermined temperature, the control section compares a comparison target signal with a reference signal where the comparison target signal is a current value of one of the first bit current sources and the reference signal is a current value obtained by adding an output current from the auxiliary least significant current source to a total output current from the lower-ordered second bit current sources all turned ON, and compensates for the current value of the first bit current source at the different temperature by supplying a digital code to the linearity correction digital-to-analog converter unit such that a difference between the reference signal and the comparison target signal becomes zero.

13. The electron beam exposure apparatus according to claim 12, wherein the correction digital-to-analog converter part includes a temperature dependent signal adjustment digital-to-analog converter unit, and the zero-adjustment is performed by supplying a digital code to the temperature dependent signal adjustment digital-to-analog converter unit such that a temperature dependent signal varying with a temperature change detected by the temperature dependent signal extraction unit becomes 0[V] at a predetermined reference temperature.

14. The electron beam exposure apparatus according to claim 9, wherein the first current sources and the second current sources are connected in parallel.

15. The electron beam exposure apparatus according to claim 9, wherein the digital-to-analog converter further comprises:

a digital data receiver; and a digital data transmitter provided in a stage preceding the digital data receiver, wherein the digital data transmitter generates modulated digital data whose state is inverted at each clock signal when digital data remain unchanged and is not inverted at each clock signal when the digital data is changed and the digital data receiver receives the digital data and the modulated digital data and reproduces a serial clock by using an exclusive logical sum of the digital data and the modulated digital data.

16. The electron beam exposure apparatus according to claim 15, wherein the digital data receiver includes a test data generation unit, and the received digital data is verified based on a generator polynomial generated by the test data generation unit.

* * * * *